(12) United States Patent
Peschke et al.

(10) Patent No.: US 8,922,267 B2
(45) Date of Patent: Dec. 30, 2014

(54) ELECTRONIC DEVICE AND METHOD FOR KICKBACK NOISE REDUCTION OF SWITCHED CAPACITIVE LOADS AND METHOD OF OPERATING THE ELECTRONIC DEVICE

(75) Inventors: Carlo Peschke, Freising (DE); Ernst Muellner, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/267,661

(22) Filed: Oct. 6, 2011

(65) Prior Publication Data

US 2012/0092055 A1    Apr. 19, 2012

(30) Foreign Application Priority Data

Oct. 15, 2010    (DE) .......................... 10 2010 048 440

(51) Int. Cl.
*H03K 17/687*    (2006.01)
*H03F 3/72*    (2006.01)

(52) U.S. Cl.
CPC ........ *H03F 3/72* (2013.01); *H03F 2203/45136* (2013.01)
USPC ............. 327/427; 327/34; 327/379; 327/382; 327/384; 327/551; 327/310; 326/21; 326/22

(58) Field of Classification Search
USPC ............... 327/34, 82, 91, 380–385, 427, 551, 327/310, 108; 326/21–24, 26–27, 82
See application file for complete search history.

(56) References Cited

U.S. PATENT DOCUMENTS

| | | | |
|---|---|---|---|
| 6,686,763 B1 * | 2/2004 | Yen | 326/30 |
| 7,176,721 B2 * | 2/2007 | Ho et al. | 326/82 |
| 7,956,652 B2 * | 6/2011 | Tomisato | 327/82 |
| 2008/0265944 A1 * | 10/2008 | Muraoka et al. | 326/86 |
| 2009/0072899 A1 * | 3/2009 | Cho et al. | 330/147 |
| 2009/0140802 A1 * | 6/2009 | Kitagawa et al. | 330/9 |
| 2009/0237119 A1 * | 9/2009 | Tomisato | 327/82 |

OTHER PUBLICATIONS

Kickback Noise Reduction Techniques for CMOS Latched Comparators, IEEE Transactions on Circuits and Systems—II: Express Briefs, vol. 53, No. 7, Jul. 2006, pp. 541-545 (Figueiredo, et al.).

* cited by examiner

*Primary Examiner* — Lincoln Donovan
*Assistant Examiner* — Patrick Chen
(74) *Attorney, Agent, or Firm* — William B. Kempler; Frederick J. Telecky, Jr.

(57) ABSTRACT

An electronic device which includes a first stage having an input capacitance, a switch, a buffer and a second stage having an input sensitive to charge injection and/or voltage glitches. An input of the buffer and the input of the second stage are coupled together at a first node which is configured to be coupled to a voltage source for supplying a reference voltage to the input of the first stage having the input capacitance. In a first configuration of the switch, the switch is arranged to either connect the input of the first stage to the first node and to disconnect the input of the first stage from an output of the buffer. In a second configuration of the switch, to connect the input of the first stage to the output of the buffer and to disconnect the input of the first stage from the first node.

20 Claims, 5 Drawing Sheets

ELECTRONIC DEVICE AND METHOD FOR KICKBACK NOISE REDUCTION OF SWITCHED CAPACITIVE LOADS AND METHOD OF OPERATING THE ELECTRONIC DEVICE

CROSS-REFERENCE TO RELATED APPLICATIONS

This patent application claims priority from German Patent Application No. 10 2010 048 440.7, filed Oct. 15, 2010, which is incorporated herein by reference in its entirety.

FIELD OF THE INVENTION

The invention relates to an electronic device and a method for kickback noise reduction when switching capacitive loads and a method of manufacturing such an electronic device.

BACKGROUND OF THE INVENTION

Integrated electronic semiconductor devices often have to cope with capacitive loads that have to be charged and discharged to certain voltage levels. There are stages with an input capacitance, as for example comparators, buffers or amplifiers that are switched on and off, as well as simple capacitances or cables.

If the drain current of a MOS transistor changes its gate-source voltage must change, too and therefore the gate charge must change. If an amplifier with a MOS input transistor is switched on or off (i.e. the bias current is switched on or off) this charge will be seen as kick-back noise at the input.

The input nodes of these stages are often connected to high impedance voltage reference sources. The input capacitances at the input nodes of these stages will then receive or release a certain amount of charge that may propagate from their input nodes, i.e. their input capacitances, to or from the high impedance voltage reference sources. The released or supplied charge can cause a voltage drop across the interconnections (wires, VIAs etc.) or at the voltage sources i.e. their output impedances. The voltage level at the input node may then vary. If this voltage level is monitored, for example by a comparator which may also be coupled to the input node, this can cause the comparator to change the state of its output signal.

FIG. 1 shows a simplified circuit diagram of an example of a first stage ST1 having an input capacitance. FIG. 1 illustrates the effect of kickback noise. There is a switched electronic stage ST1, which may be an amplifier or a comparator or any other device stage having an input capacitance (also a simple switched capacitor etc.). The first stage ST1 may comprise an input stage with a differential pair of transistors, as for example, transistors M1 and M2. The input stage may further be coupled to a current source CS for feeding a tail current to the input stage. In order to save power or for any other reasons, the input stage M1, M2 may be switched off by disconnecting the input stage from the current source CS by switch SW.

The node N1 connects the gate of one of the input transistors M1 to a voltage source VS. This voltage source VS may be a voltage source having a comparatively high output impedance RI. It may be modeled with a reference voltage source VREF and an output impedance RI as shown in FIG. 1. There might be a second stage ST2 having an input that is sensitive to charge injection and/or voltage glitches. The second stage ST2 may be comparator. A comparator may be coupled with an inverting input to the node N1. The positive input of the comparator may receive another reference voltage VM. The output signal COMPOUT of comparator may then be used as an indicator as to whether the voltage level at node N1 is greater or lower the reference voltage level VM. The input MOSFET M1 (as all MOS transistors) of the first stage ST1 has the input capacitances CGD (gate to drain capacitance) and CGS (gate to source capacitance). If the switch SW is turned off (disconnected) the input capacitance (CGD, CGS) of the input node INN releases a charge QK that can propagate towards voltage source VS causing a voltage drop at resistor RI. The same effect in reverse can occur, when the first stage is activated by switch SW. The charge may then propagate towards the input capacitances of the first stage ST1. This may decrease or increase the voltage level at node N1, thereby varying the voltage at the inverting input of the comparator. In response to this, the output COMPOUT of the comparator may change.

FIG. 2 shows a simplified circuit diagram of a configuration which is basically similar to the one shown in FIG. 1. However, the circuit shown in FIG. 2 further includes a high performance buffer BUF for buffering the reference voltage provided by the voltage source VS. The kickback noise or kickback charge QK propagating from the input node ST1IN towards voltage reference source VS is then blocked by high performance buffer BUF. However, even in this situation, the voltage level at node N1 may vary. Therefore, the comparator ST2 is coupled between the positive input of high performance buffer BUF and voltage source VS. However, a main disadvantage of the configuration shown in FIG. 2 is the power consumption of the high performance buffer. The buffer BUF constantly consumes supply current and may also add an offset voltage.

SUMMARY OF THE INVENTION

It is a general object of the invention to provide an electronic device and a method for kickback noise reduction when switching capacitive loads and a method for manufacturing such a device.

According to an aspect of the invention, there is an electronic device comprising a first stage having an input capacitance, a switch, a buffer and a second stage. The second stage has an input that is sensitive to charge injection and/or a voltage glitch. An input of the buffer and the input of the second stage may be coupled together at a first node. The first node may then be configured to be coupled to a voltage source for supplying a reference voltage to the input of the first stage having the input capacitance. In a first configuration of the switch, the switch may be arranged to connect the input of the first stage to the first node. Also in the first configuration, the switch disconnects the input of the first stage from an output of the buffer. In a second configuration of the switch, the switch is arranged to connect the input of the first stage to the output of the buffer and to disconnect the input of the first stage from the first node. This aspect of the invention provides that the input of the first stage is either driven by the buffer or connected to the first node. The input capacitance of the first stage can then be charged by the buffer. The buffer itself can have a smaller input capacitance than the first stage. Furthermore, the buffer can be switched off after having charged the input capacitance of the first stage and when the switch is in the first configuration. This saves power. The buffer may be very simple having a rather large offset (input related offset) and low performance. In the context of this invention, the buffer is considered to be an amplifier with a gain of one. The output signal of the buffer may then deviate from the input voltage (reference voltage level at the first node) by the offset. This invention provides that a buffer with a rather high offset can be used and that kickback noise at the input of the second stage is still reduced. Furthermore, also the power consumption can be reduced, as the buffer can have low power consumption and be switched off after charging the input of the first stage.

In another aspect of the invention, the electronic device may further be configured such that the default configuration of the switch is the second configuration. This provides that the input of the first stage is not accidentally connected to the first node.

In another aspect of the invention, the electronic device may further be configured to activate the buffer before the switch switches from the second to the first configuration. This provides that the input capacitance is charged before the input of the first stage is connected to the first node, i.e. before it is connected to the reference voltage source. This helps to reduce the amount of kickback noise.

In an aspect of the invention, the electronic device may further be configured to activate the first stage before the switch switches from the second to the first configuration. This prevents that charge is fed to the first node after the switch is in the first configuration.

In an aspect of the invention, the electronic device may further be configured to switch the switch from the second to the first configuration only after the output signal of the buffer has settled.

In still another aspect of the invention, the electronic device may further be configured to switch the switch from the first into the second configuration before changing the voltage and/or the charge of the input capacitance at the input of the first stage. Activating and deactivating the first stage generally relates to a change of the voltage and/or charge of the input capacitance of the first stage. The first stage can be an active device that is switched on or off. However, in an embodiment, it may also be a switched capacitor or a capacitor that is configured to increase or decrease the charge and/or the voltage. These changes of the charge and/or voltage of the input capacitor should only occur while the switch is in the second configuration. The buffer can block the kickback noise even if it is switched off.

In still another aspect of the invention, the electronic device may further be configured such that the buffer is deactivated after switching the switch from the second configuration to the first configuration. If not used anymore, the buffer can be deactivated while the switch is in the first configuration. If the buffer is needed again, the buffer may remain activated during several changes of the switch from first to second and second to first configurations. The buffer may then not be deactivated after switching the switch from the second to the first configuration. The buffer may be kept deactivated even if the switch is switched from the first into the second configuration if the first stage is deactivated. However, if the first stage is still on and the buffer is needed, the buffer may advantageously be activated before the switch changes from the first configuration to the second configuration. The sooner the buffer is switched off, after having settled and properly charged the input capacitance of the first stage, the more power can be saved. However, in some embodiments, it may be useful to leave the buffer activated in order to reduce switching delays etc. The buffer may be deactivated at least a certain time, while the switch is in the second configuration. In the context of this invention, "activating" means switching on or powering or supplying with a supply voltage. "Deactivating" means switching off, turning off, or switching into a low power state in which power consumption is lower than in the active mode.

The first stage can comprise or be any stage that has in input capacitance with changing charge and/or voltage. In some embodiments of the invention, the first stage may comprise, for example a differential amplifier, a comparator, a capacitor and/or a transistor.

In an aspect of the invention, the buffer may comprise a MOSFET input transistor. The buffer may have a differential input stage comprising two transistors. The transistors may advantageously be MOSFETs. An area of an input transistor (MOSFET) may then be configured as a function of the maximum allowable charge injection into the first node when the switch is switched from the second configuration to the first configuration. The area is the channel width of the MOSFET multiplied by the channel length of the MOSFET (i.e. the area A is defined as $A=W*L$, where W is the width of the channel and L is the length of the channel of the MOSFET).

The invention also provides a method of operating the electronic device configured in accordance with the aspects and embodiments of the invention, accordingly, the buffer may be activated. The first stage may then be activated. However, the first stage may also be activated before the buffer, or they may be activated at the same time. The switch is in the default position, i.e. in the second configuration. The switch is then switched from the second configuration to the first configuration. The switch is advantageously only switched after the buffer output has settled. According to aspects of the invention, the buffer may have an offset. This means that the output of the buffer settles to an output voltage level that deviates from the reference voltage level provided by the reference voltage source by the offset voltage. An aspect of this invention provides that a buffer with rather high offset but rather small input capacitance can be used and the kickback noise at the input of the second stage is still reduced.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 1:
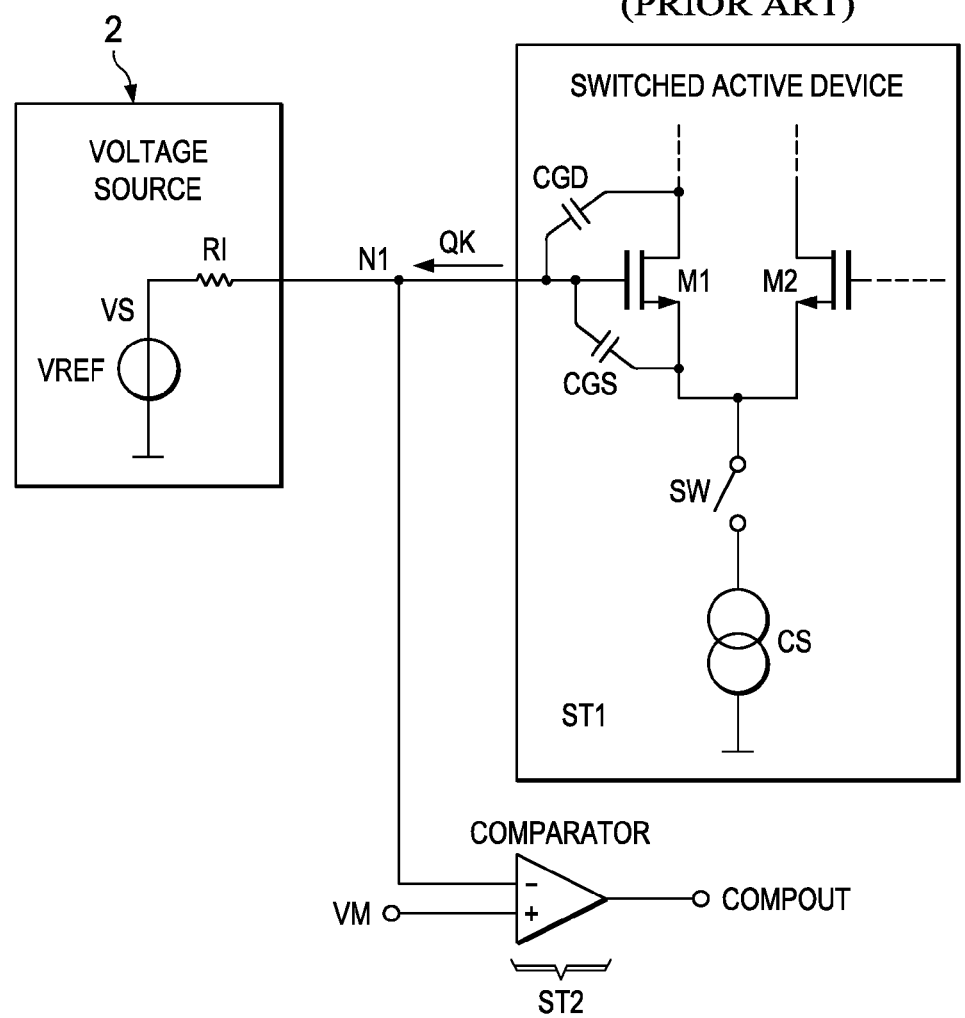
FIG. 1 is a simplified circuit diagram of an electronic device using a switched active stage according to the prior art.
Figure 2:
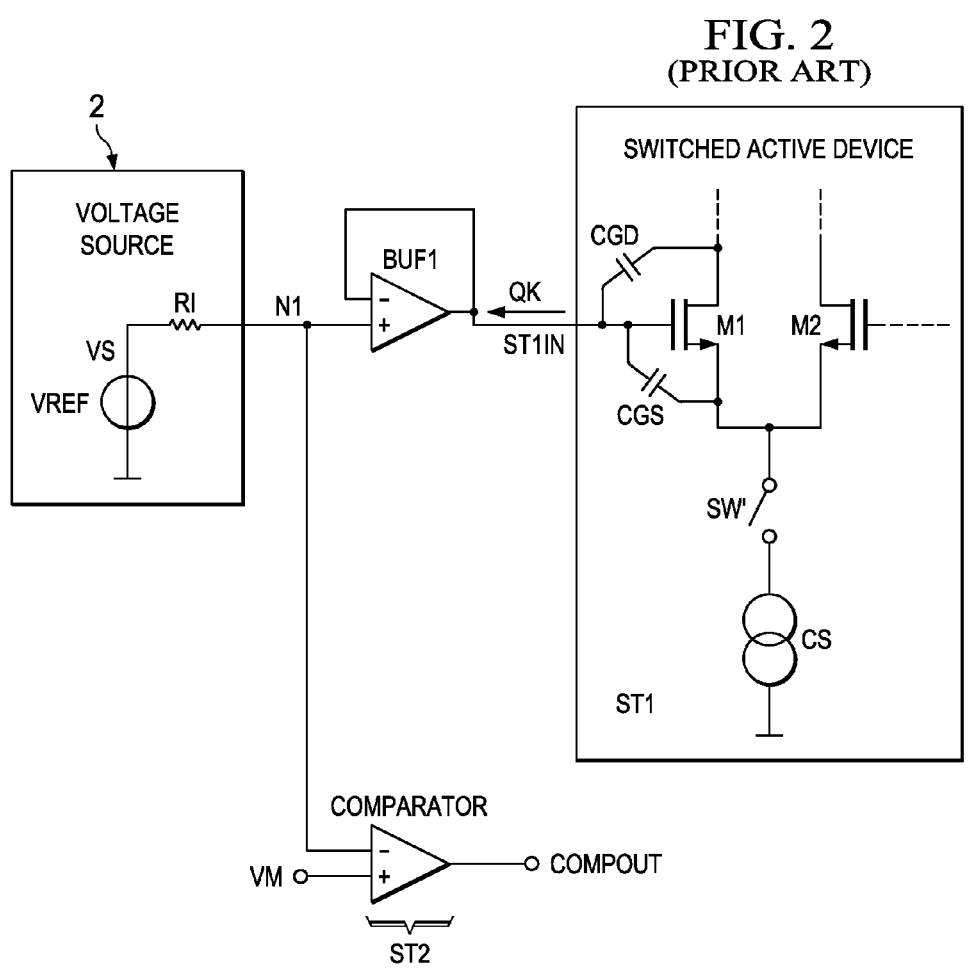
FIG. 2 is a simplified circuit diagram of an electronic device using a switched active stage according to the prior art.
Figure 3:
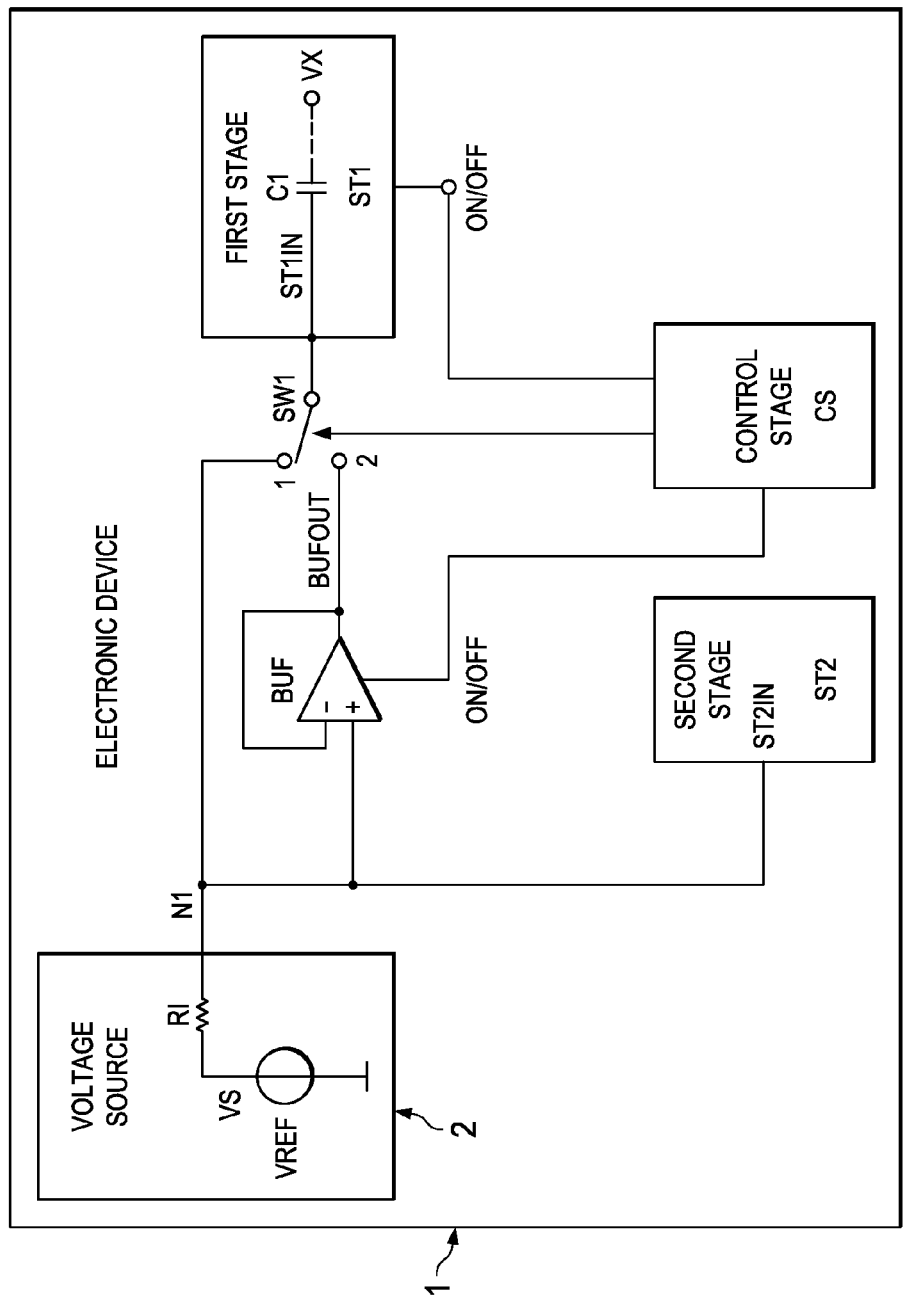
FIG. 3 is a simplified circuit diagram of an electronic device according to the invention.

FIG. 3 shows a simplified diagram of an embodiment of the invention. There is an electronic device 1 comprising a first stage ST1 having an input ST1IN. The input has in input capacitance C1 which is represented by capacitor C1 which can be coupled with the other side to any kind of reference of supply voltage VX. There is a second stage ST2 having an input ST2IN which is sensitive to charge injection and/or glitches. The second stage ST2 may be a comparator or an amplifier or the like. There is a buffer BUF. The buffer BUF may be a non-inverting amplifier with gain one. The positive input of the buffer (operational amplifier) is connected to the first node N1. The output of the buffer (BUF) is (BUFOUT). There is a reference voltage source VS, which is configured to supply a reference voltage VREF to the first node N1. The reference voltage VREF is conceived to be fed to the input ST1IN of the first stage ST1. The voltage source VS has an output resistance or impedance RI. There is further a switch. The switch has two configurations. In a first configuration 1, the switch connects the input ST1IN of the first stage with the first node N1. In a second configuration 2, the switch connects the output of buffer (BUFOUT) with the input ST1IN of the first stage. In the first configuration 1, the input of the first stage ST1 is fed with the reference voltage. In the second configuration 2, the buffer (BUF) feeds the input voltage VREF to the input ST1IN of the first stage ST1. The first stage ST1 can be switched off or the input capacitance C1 can change the charge or the voltage due to other reasons. A control stage CNTL controls the switching of switch SW. The buffer (BUF) is optimized according to the following considerations. The offset of the buffer (BUF) depends on the area of the input transistors. The area is the product of the channel width and the channel length of the MOSFET. In this embodiment, the input transistors are assumed to be MOSFET transistors. The relationship between the area and the offset voltage is then approximated as:

$$VOFF = \frac{\sigma VT}{\sqrt{A}}, \quad (1)$$

Wherein σVT is a parameter given by the technology (relating to the standard deviation of an assumed Gaussian distribution of the error due to production spread which is well known in the art), A is the area (channel width multiplied by the channel length (A=W*L) and VOFF is the offset voltage of the buffer. The input capacitance (CINBUF) of the buffer is also a function of the area of the input transistors of the buffer according to the following equation:

$$CINBUF = COX \cdot A \quad (2)$$

COX is a parameter of the technology. It depends also on the gate-source voltage VGS. The charge that is injected into node N1, i.e. the kickback noise, can then be approximated by the input capacitance (CINBUF) of the buffer (CBUF) integrated over the voltage VGS:

$$QBUF = \int_0^{VGS} CINBUF(V) dV \quad (3)$$

VGS is the gate source voltage of the input transistor of the buffer (BUF) when properly biased for operation. For a constant capacitance (CINBUF), the integral would be equal to VGS*CINBUF. The charge contributed by stage ST1 is only the product of C1 and VOFF (since VOFF is small a constant C1 can be assumed). If the switch is changed from configuration 2 to configuration 1, a charge is injected into node N1 which is a function of the offset voltage VOFF of the buffer (BUF) and the input capacitance C1 of the first stage ST1:

$$QOFF = \frac{C1 \sigma VT}{\sqrt{ABUF}} \quad (4)$$

The minimum kickback charge (kickback noise) is injected, if the charges of equation (3) and equation (4) are equal:

$$QOFF = QBUF = > ABUF \int_0^{VGS} COX(V) dV = \frac{C1 \sigma VT}{ABUF^{1/2}} \quad (5)$$

This provides the optimum area ABUFOPT of the input transistor(s) of the buffer (BUF):

$$ABUFOPT = \left( \frac{C1 \sigma VT}{\int_0^{VGS} COX(V) dV} \right)^{2/3} \quad (6)$$

Accordingly, the buffer is optimized with respect to the area of its input transistors. The optimum area is ABUFOPT. The buffer (BUF), i.e. its input transistors, and more specifically their area is designed as a function of the charge Q that is injected into node N1, i.e. the kickback noise. More specifically, the buffer (BUF), i.e. its input transistors, and more specifically their area is designed as a function of the technology parameters COX, and the gate source voltage VGS as well as the input capacitance C1 of the first stage ST1.

Figure 4:
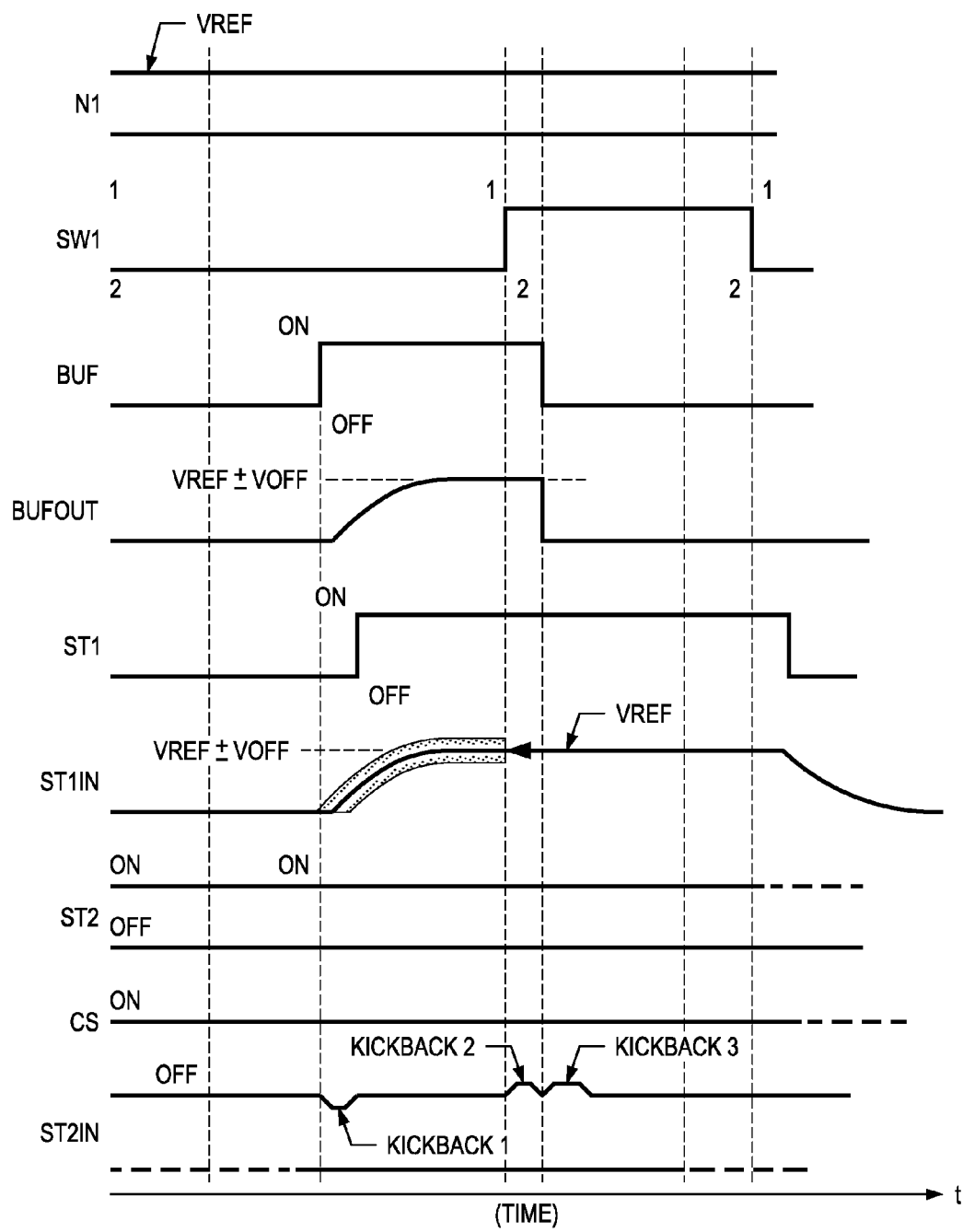
FIG. 4 is a simplified diagram showing waveforms relating to the electronic device according to the invention.

FIG. 4 shows a diagram showing waveforms relating to the embodiment shown in FIG. 3. The diagram illustrates the timing of the electronic device according to aspects of the invention. N1 is the voltage at node N1. It is VREF. It is supposed that the voltage source VS is connected to node N1 and node N1 is charged. The switch SW1 is in the default configuration which is configuration 2. This means that the switch connects the output of the buffer (BUF) and the input ST1IN of the first stage ST1. The buffer is off at the beginning and then switched on (activated). The output voltage (BUFOUT) of the buffer increases and settles to VREF+VOFF. VOFF can be positive or negative. The switching of the buffer (BUF) injects a certain amount of charge (kickback noise) into node N1. This is indicated as KICKBACK1. This charge causes a small voltage deviation at the input ST2IN of the second stage ST2. However, the buffer (BUF) is specifically optimized for input capacitance versus offset voltage, which means the buffer has input transistors with an area ABUFOPT according to the above equations. As the area ABUFOPT is small, the input capacitance (CINBUF) of the buffer is also small. The disturbance KICKBACK1 is therefore also small.

The first stage ST1 is also off at the beginning and then switched on. Either BUF or ST1 can be switched on first or they may be switched on (activated) at the same time. The input voltage at the input node STIN of the first stage ST1 also rises in accordance with the output voltage (BUFOUT) of the output of the buffer (BUF). Accordingly, also ST1IN settles to VREF+VOFF. VOFF can be positive or negative. The input capacitance C1 of the first stage ST1 is then charged to VREF+VOFF. The second stage ST2 may be switched on from the beginning. The control stage CS is switched on all the time. This is necessary in order to keep the switch SW1 in the default configuration 2. In order to apply the voltage VREF to the input ST1IN of the first stage, switch SW1 has to be switched from configuration 2 to configuration 1. Now, the input STIN of the first stage ST1 is connected to the first node N1 and thereby to the voltage source VS and to the input of the second stage ST2. Due to the switching of SW1 from configuration 2 to configuration 1, a certain amount of charge is injected into node N1, which appears as voltage variation at input ST2IN of the second stage ST2. This is referred to as KICKBACK2. However, since the voltage variation at input ST1IN is only the offset voltage VOFF in relation to the input capacitance C1, the amount of kickback noise is rather small. The absolute value of VOFF is usually substantially smaller than the absolute value of VREF.

The buffer (BUF) can be switched off, after having settled to VREF+VOFF or VREF−VOFF and after the switch has been switched to configuration 2. The output of the buffer (BUF) is then disconnected from the input of the first stage ST1. This can cause a third charge injection, which is indicated as KICKBACK3. However, the buffer (BUF) may also remain activated (powered) even after the switch has switched to configuration 2. The sooner buffer (BUF) is switched off (deactivated) the more power can be saved. According to an aspect of the invention, all noise impulses KICKBACK1, KICKBACK2 and KICKBACK3 are minimized. More specifically, the strength of the impulses (the charge injected due to the above described effects) may be equal (different) as described with respect to equations (3), (4) and (5).

Figure 5:
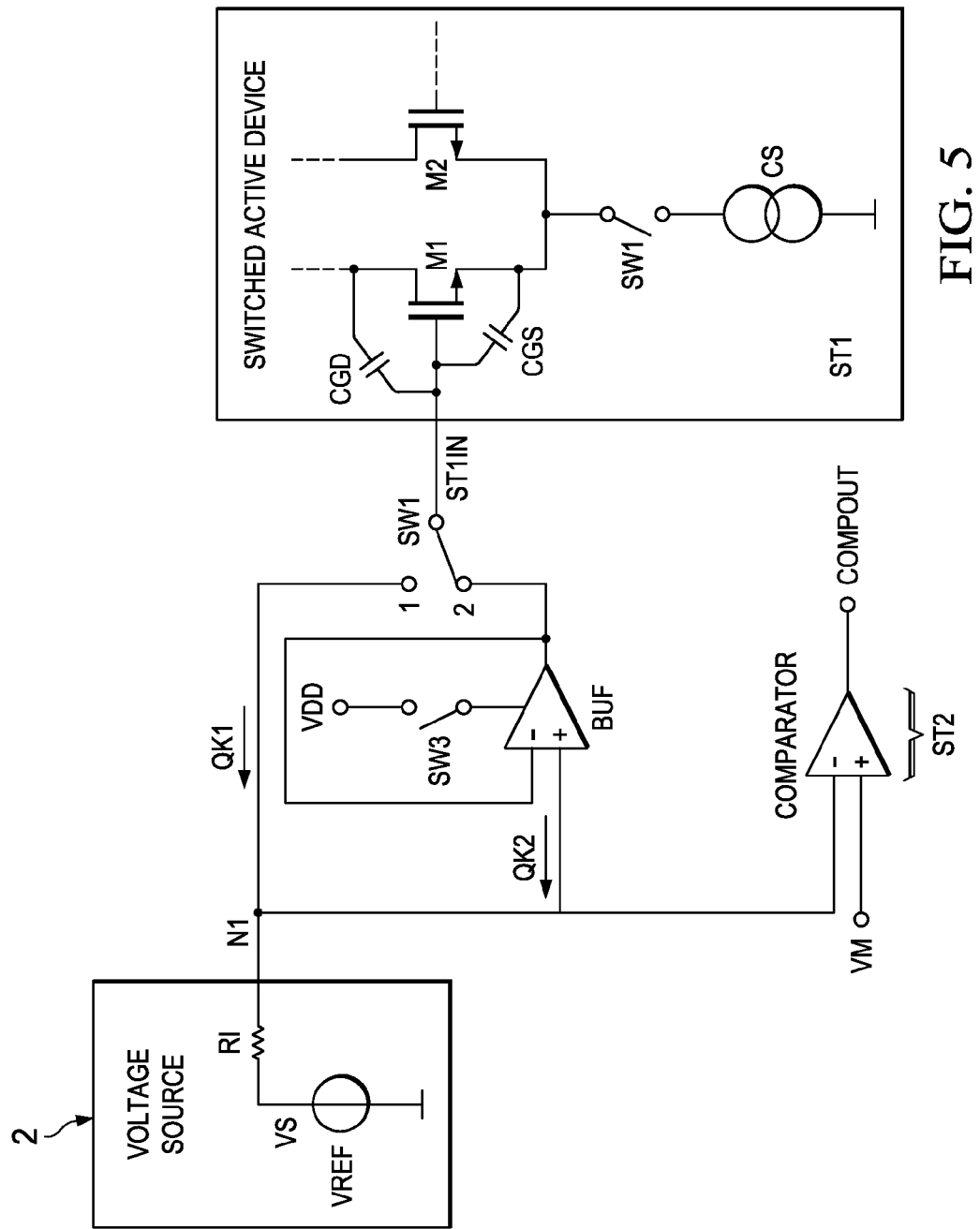
FIG. 5 is a simplified circuit diagram of an electronic device according to the invention.

FIG. 5 shows a simplified circuit diagram of an embodiment of the invention. There is a first stage, in this embodiment a switched active electronic stage ST1, which may be, for example an amplifier, a comparator or a buffer etc. The switched active stage ST1 may be switched off using switch SW. Switch SW may disconnect current source CS which supplies a tail current to the differential input stage comprising input transistors M1 and M2. Input transistor M1 may be connected to node N1 for connecting it to a voltage source VS. This voltage source VS may be a high impedance voltage source, which means that the inner resistance RI is significant and cannot be neglected. The parasitic input capacitances CGD and CGS of the MOS transistor M1 may release charge when the input stage is switched off. These are the input capacitances of the first stage. This charge may propagate as charge QK1 towards voltage source VS of from the source to the input. This is avoided by switching switch SW1 to the output BUFOUT of low performance buffer (BUF). This low performance buffer (BUF) is dimensioned according to the aspects of the invention. The area of the input transistors is ABUFOPT. The switching of SW1 can be performed as shown in FIG. 4.

Low performance buffer (BUF) may also have an input capacitance and may therefore also release a certain amount of charge QK2 when switched off by switch SW3. An optimum is reached if the effect caused by the kickback charge QK2 is substantially equal to the effect caused by kickback charge QK1.

Although the invention has been described in detail, it should be understood that various changes, substitutions and alterations can be made thereto without departing from the spirit and scope of the invention as defined by the appended claims.

The invention claimed is:

1. An electronic device comprising:
a first stage (ST1) having an input capacitance (C1); a switch (SW1); a buffer stage (BUF) coupled between the first stage and a second stage (ST2) having an input sensitive to charge injection or voltage glitches, an input of the buffer and the input of the second stage being coupled together at a first node (N1) which is configured to be coupled to a voltage source for supplying a reference voltage (VREF) to the input of the first stage, wherein, in a first configuration of the switch, the switch (SW1) is arranged to connect the input (ST1IN) of the first stage to the first node (N1) and to disconnect the input (ST1IN) of the first stage from an output (BUFOUT) of the buffer or, in a second configuration of the switch, to connect the input (ST1IN) of the first stage to the output (BUFOUT) of the buffer and to disconnect the input (ST1IN) of the first stage from the first node (N1), wherein an area of input transistors of the buffer stage is determined by:

$$ABUFOPT = \left(\frac{C1\sigma VT}{\int_0^{VGS} COX(V)dV}\right)^{2/3} \quad (6)$$

Where ABUFOPT is the area of the input transistors,
COX is the oxide capacitance,
VGS is the gate to source voltage,
σVT is the standard deviation of an assumed Gaussian distribution of the error due to production spread, and
C1 is the input capacitance of the first stage ST1, wherein charge injection or voltage glitches into the second stage are minimized.

2. The electronic device according to claim 1, being further configured such that the default configuration of the switch is the second configuration.

3. The electronic device according to claim 1, being further configured to activate the buffer before the switch switches from the second to the first configuration.

4. The electronic device according to claim 1, being further configured to activate the first stage before the switch switches from the second to the first configuration.

5. The electronic device according to claim 4, being further configured to switch the switch from the second to the first configuration only after the output signal of the buffer has settled.

6. The electronic device according to claim 5, being further configured to switch the switch from the first into the second configuration before changing at least one of the voltage or the charge of the input capacitance at the input of the first stage.

7. The electronic device according to claim 6, being further configured to switch the switch into the second configuration before deactivating the first stage.

8. The electronic device according to claim 7, wherein the buffer is deactivated after switching the switch from the second configuration to the first configuration.

9. The electronic device according to claim 8, wherein the electronic device is further configured to keep the buffer deactivated when the switch is switched from the first into the second configuration.

10. The electronic device according to claim 9, wherein the first stage comprises a differential amplifier, a comparator, a capacitor or a transistor.

11. The electronic device according to claim 7, wherein the buffer is not deactivated after switching the switch from the second to the first configuration.

12. The electronic device according to claim 1, wherein the buffer comprises a MOSFET input transistor and an area of the input transistor is determined as a function of the maximum allowable charge injection into the first node when the switch is switched from the second configuration to the first configuration.

13. A method of operating an electronic device comprising a first stage, a switch, a buffer stage coupled between the first stage and a second stage having an input sensitive to charge injection comprising:
activating the buffer; wherein an area of input transistors of the buffer stage is determined by:

$$ABUFOPT = \left(\frac{C1\sigma VT}{\int_0^{VGS} COX(V)dV}\right)^{2/3} \quad (6)$$

Where ABUFOPT is the area of the input transistors,
COX is the oxide capacitance,
VGS is the gate to source voltage,
σVT is the standard deviation of an assumed Gaussian distribution of the error due to production spread, and
C1 is the input capacitance of the first stage ST1;
activating the first stage; and
switching the switch from a second configuration to couple an input of the first stage to an output of the buffer and to disconnect the input of the first stage from a reference voltage to a first configuration to couple an input of the first stage to the reference voltage and disconnect the input of the first stage from the output of the buffer, wherein charge injection or voltage glitches into the second stage are minimized.

14. The method of claim 13, wherein the buffer is activated before the switch switches from the second to the first configuration.

15. The method of claim 14, wherein the first stage is activated before the switch switches from the second to the first configuration.

16. The method of claim 13, wherein the first stage is activated before the switch switches from the second to the first configuration.

17. The method of claim 13, further comprising waiting for an output signal of the buffer to settle before switching the switch from the second to the first configuration.

18. The method of claim 13, further comprising switching the switch from the first to the second configuration before changing at least one of the voltage or charge of the input capacitance at the input of the first stage.

19. The method of claim 18, further comprising switching the switch from the second to the first configuration and then deactivating the buffer.

20. The method of claim 18, wherein the buffer stays activated when the switch is switched from the first to the second configuration.

* * * * *